US008593139B2

(12) United States Patent
Ohta et al.

(10) Patent No.: US 8,593,139 B2
(45) Date of Patent: Nov. 26, 2013

(54) MAGNETIC SENSOR

(75) Inventors: Naoki Ohta, Tokyo (JP); Hiraku Hirabayashi, Tokyo (JP); Masanori Sakai, Tokyo (JP); Hiroshi Naganuma, Tokyo (JP)

(73) Assignee: TDK Corporation, Tokyo (JP)

( * ) Notice: Subject to any disclaimer, the term of this patent is extended or adjusted under 35 U.S.C. 154(b) by 338 days.

(21) Appl. No.: 12/947,328

(22) Filed: Nov. 16, 2010

(65) Prior Publication Data

US 2011/0221433 A1 Sep. 15, 2011

(30) Foreign Application Priority Data

Mar. 10, 2010 (JP) ................................ 2010-053570

(51) Int. Cl.
*G01R 33/02* (2006.01)
(52) U.S. Cl.
USPC ......................................................... 324/252
(58) Field of Classification Search
None
See application file for complete search history.

(56) References Cited

U.S. PATENT DOCUMENTS

| 4,626,946 | A  | * | 12/1986 | Vinal | 360/315 |
| 7,619,431 | B2 | * | 11/2009 | De Wilde et al. | 324/750.3 |
| 2003/0094944 | A1 |  | 5/2003 | Suzuki et al. |  |
| 2008/0186023 | A1 | * | 8/2008 | Biziere et al. | 324/252 |
| 2009/0009163 | A1 | * | 1/2009 | Yamada | 324/244 |
| 2009/0108841 | A1 |  | 4/2009 | Abe et al. |  |
| 2009/0284254 | A1 | * | 11/2009 | Kasajima | 324/207.21 |

FOREIGN PATENT DOCUMENTS

| CN | 1417872 A | 5/2003 |
| JP | 6-294853 | 10/1994 |
| JP | 10-319103 | 12/1998 |
| JP | 11-64474 | 3/1999 |
| JP | 2009-236889 A | 10/2009 |

OTHER PUBLICATIONS

Extended European Search Report issued Apr. 18, 2011, in European Patent Application No. 10252021.0
Combined Chinese Office Action and Search Report issued Apr. 26, 2013, in Chinese Patent Application No. 201010596371.2 with English translation of category of cited documents.

* cited by examiner

*Primary Examiner* — Jermele M Hollington
*Assistant Examiner* — Trung Nguyen
(74) *Attorney, Agent, or Firm* — Oblon, Spivak, McClelland, Maier & Neustadt, L.L.P.

(57) ABSTRACT

A magnetic sensor includes a spin valve-type magneto-resistive element, a voltage detection part, a coil, and a current control part, the coil being configured to apply a measuring magnetic field to the spin valve-type magneto-resistive element upon application of a current, the voltage detection part being configured to output a detection signal to the current control part upon detecting an output voltage of the spin valve-type magneto-resistive element reaching a predetermined voltage value, the current control part being configured to control the current to unidirectionally increase or unidirectionally decrease a strength of the measuring magnetic field from an initial value, but upon input of the detection signal, control the current to return the strength of the measuring magnetic field to the initial value, the initial value being a magnetic field strength where the spin valve-type magneto-resistive element reaches saturation magnetization.

6 Claims, 6 Drawing Sheets

MAGNETIC SENSOR

TECHNICAL FIELD

The present invention relates to a magnetic sensor using a spin valve-type magneto-resistive element.

BACKGROUND OF THE INVENTION

Current sensors using a magneto-resistive element (MR element) have been attracting attention in recent years. Such a current sensor can detect a DC magnetic field and is therefore applicable to various areas including battery control of hybrid vehicles.

Inherently, the MR element is characterized by poor linear characteristics and narrow effective sensitivity range for detecting an external magnetic field. When adopting the MR element for magnetic sensors, therefore, it has been required to shift the operating point to an area having excellent linear characteristics, for example, by applying a bias magnetic field to the MR element, as disclosed in Japanese Unexamined Patent Application Publication Nos. 10-319103 and 6-294853. However, this technology limits the output of the MR element or the like, causing a problem of reducing the freedom of design.

In the field of the magnetic sensor, therefore, a magnetic balance system has been widely used as means for solving the problem. The magnetic balance system is a method in which a coil is disposed around a MR element, a current is applied by feedback control to let the coil generate a measuring magnetic field counterbalancing an external magnetic field, and a strength of the external magnetic field to be measured is obtained from a value of the current (see Japanese Unexamined Patent Application Publication No. 11-64474). In principle, excellent linear characteristics and wide effective sensitivity range can be secured by the magnetic balance system, so that this system is suitable for a current sensor for measuring a high-voltage direct current, such as a battery monitoring sensor of a hybrid vehicle.

Thus, the MR element is expected to be applied to the field of the magnetic sensor. Then, such expectations are running high since a high-performance spin valve-type MR element has been developed along with development of a magnetic head of a hard disk. Examples of the spin valve-type MR elements include a CIP (current in-plane) type GMR element using a giant magneto-resistive effect in which a current flows in a film plane, a CPP (current perpendicular to plane) type GMR element in which a current is passed perpendicular to a film plane, and a TMR element in which a current is passed using a tunneling effect caused by applying a voltage perpendicular to a film plane.

Among them, the TMR element is particularly excellent in output characteristics, so that it is expected that the S/N ratio of the system can be improved and the circuit configuration can be simplified by applying it to the field of the magnetic sensor.

However, the spin valve-type MR element not only has poor linear characteristics as described above but also has hysteresis characteristics with a high coercive force Hc. In the case where the above magnetic balance system is applied, accordingly, if a control current overshoots, there is a problem that the external magnetic field cannot be measured correctly. More specifically, once the MR element has reached magnetization saturation by overshoot, then, under the influence of hysteresis, the magnetic field will be detected at an unintended route portion of the hysteresis curve, thereby causing a measurement error of the magnetic field strength approximately corresponding to the coercive force Hc.

SUMMARY OF THE INVENTION

It is an object of the present invention to provide a high-performance magnetic sensor capable of detecting an external magnetic field correctly without being affected by hysteresis.

In order to achieve the above object, a magnetic sensor according to the present invention comprises a spin valve-type magneto-resistive element, a voltage detection part, a coil, and a current control part.

The coil is configured to apply a measuring magnetic field to the spin valve-type magneto-resistive element upon application of a current. The voltage detection part is configured to output a detection signal to the current control part upon detecting an output voltage of the spin valve-type magneto-resistive element reaching a predetermined voltage value.

The current control part is configured to control the current to unidirectionally increase or unidirectionally decrease a strength of the measuring magnetic field from an initial value, but upon input of the detection signal, control the current to return the strength of the measuring magnetic field to the initial value.

First of all, since the magnetic sensor according to the present invention measures an external magnetic field using the spin valve-type MR element, miniaturization can be achieved by considerably improving measurement performance, as described above.

In the magnetic sensor according to the present invention, moreover, since the coil applies a measuring magnetic field to the spin valve-type magneto-resistive element upon application of a current and the current control part controls the current to unidirectionally increase or unidirectionally decrease a strength of the measuring magnetic field from an initial value, a magnetic field to be measured can be counterbalanced or partially canceled.

Furthermore, since the voltage detection part detects an output voltage of the spin valve-type magneto-resistive element reaching a predetermined voltage value, a strength of the magnetic field to be measured can be calculated based on a current value of the coil at this moment, as in the above magnetic balance system.

However, the above predetermined voltage value should be properly determined based on the relationship between a magnetic field applied to the spin valve-type magneto-resistive element and an output voltage therefrom. Preferably, the predetermined voltage value is a value to be detected when the strength of the magnetic field generated from the coil is equal to the strength of the magnetic field to be measured. In other words, the predetermined voltage value is preferably a value to be detected when no magnetic field is applied to the spin valve-type magneto-resistive element.

The characteristic feature of the present invention resides in that the above initial value is a magnetic field strength where the spin valve-type magneto-resistive element reaches saturation magnetization and that the voltage detection part outputs a detection signal to the current control part upon detecting an output voltage of the spin valve-type magneto-resistive element reaching a predetermined voltage value and the current control part controls the current of the coil to return the magnetic field strength to the initial value upon input of the detection signal. This feature is quite different from the magnetic balance system where feedback control is performed by a negative feedback circuit.

With this characteristic feature, every time the measurement is completed, the strength of the applied magnetic field is returned to the initial value and the spin valve-type magneto-resistive element reach magnetization saturation. Therefore, the operating point of the current control always lies on a certain route portion of linear route portions of the hysteresis curve. Accordingly, even if a current flowing through the coil overshoots for any reason and the magnetic field is detected at an unintended route portion, subsequent measurements can be performed at an intended route portion.

According to the magnetic sensor of the present invention, therefore, the external magnetic field can be measured with the output voltage of the magneto-resistive element and the strength of the applied magnetic field being kept in a one-to-one relationship without being affected by hysteresis.

According to the present invention, therefore, it is possible to provide a high-performance magnetic sensor capable of detecting an external magnetic field correctly without being affected by hysteresis.

The other objects, constructions and advantages of the present invention will be further detailed below with reference to the attached drawings. However, the attached drawings show only illustrative examples.

DESCRIPTION OF THE PREFERRED EMBODIMENTS

Figure 1:
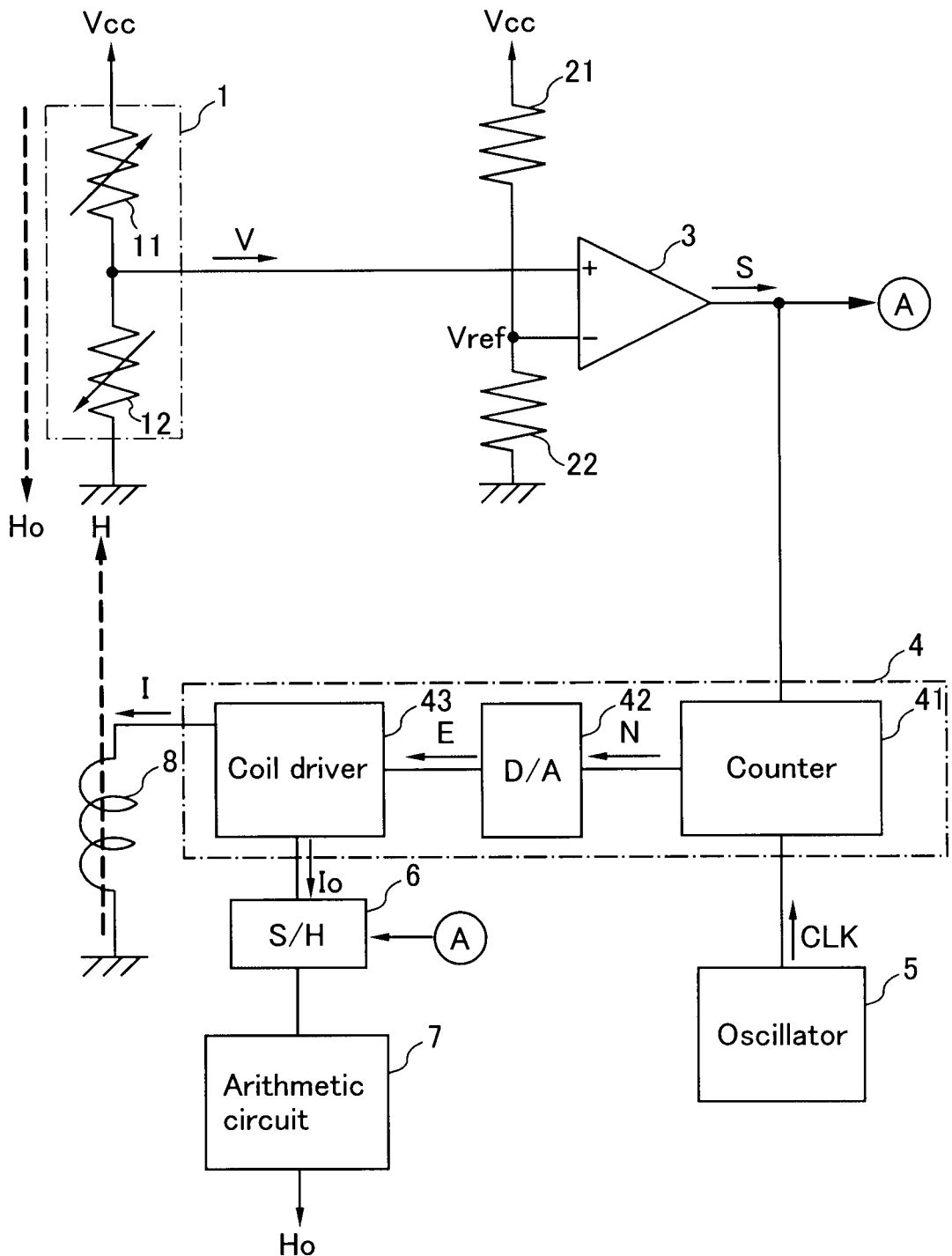
FIG. 1 is a circuit diagram of a magnetic sensor according to the present invention.

FIG. 1 is a circuit diagram of a magnetic sensor according to the present invention. The magnetic sensor includes a magneto-resistive element circuit 1 (hereinbelow, MR element circuit 1), voltage-dividing resistors 21, 22, a voltage detection part 3, a current control part 4, an oscillator 5, a sample and hold circuit (S/H) 6, an arithmetic circuit 7, and a coil 8.

Like the above magnetic balance system, this circuit is designed to control a current I flowing through the coil 8 with the current control part 4, counterbalance a measurement target magnetic field Ho around the MR element circuit 1 with a generated measuring coil magnetic field H, and detect a strength of the measurement target magnetic field Ho based on a current value Io at this moment. Individual components of the circuit and their effects will be described first, followed by details of the current control.

The MR element circuit 1 is provided with two MR elements 11, 12 connected in series. One MR element 11 has a terminal connected to a power supply Vcc, while the other MR element 12 has a grounded terminal. The MR elements 11, 12 are each a two-terminal spin valve-type MR element, such as a TMR element or a GMR element, and their pinned layers have magnetization directions 180 degrees different from each other.

Figure 2:
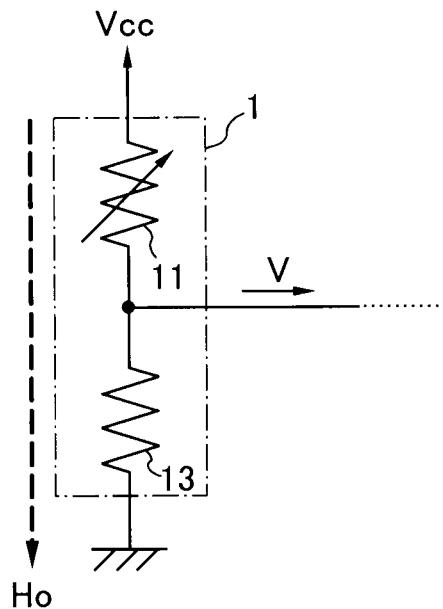
FIG. 2 is a circuit diagram showing a modification of a MR element circuit.
Figure 3:
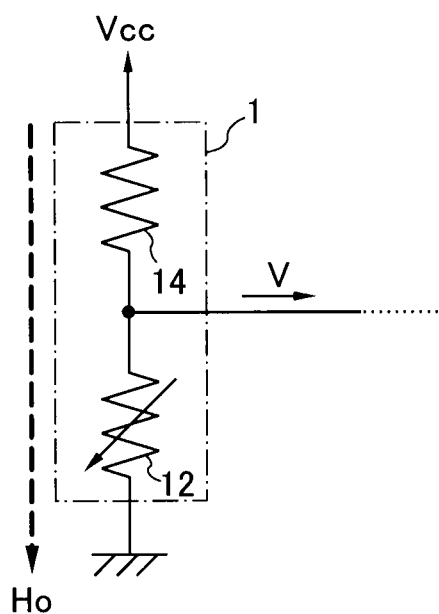
FIG. 3 is a circuit diagram showing another modification of a MR element circuit.

An output voltage V of the MR element circuit 1 is input to the voltage detection part 3 from a junction between the MR elements 11, 12. That is, the MR element circuit 1 has a half-bridge circuit of the MR elements 11, 12. However, it is not limited to such a circuit configuration but may have a resistor 13, for example, in place of the MR element 12 on the side of the ground, as shown in FIG. 2. Alternatively, a resistor 14 may be provided in place of the MR element 11 on the side of the power supply Vcc, as shown in FIG. 3. Moreover, it is, of course, possible to use a full-bridge circuit.

The MR element circuit 1 is provided in a detection head to be exposed to the external measurement target magnetic field Ho. As is well known, since the MR elements 11, 12 have the property of varying in resistance according to an applied magnetic field, the output voltage V to be output to the voltage detection part 3 has a voltage value corresponding to a strength of a surrounding magnetic field, i.e., a synthetic magnetic field of the measurement target magnetic field Ho and the coil magnetic field H.

The voltage detection part 3 detects that the output voltage value V has reached a reference voltage value Vref by comparing the output voltage value V of the MR element circuit 1 with the reference voltage value Vref. The reference voltage value Vref is applied to a (−) terminal of the voltage detection part 3 by the voltage-dividing resistors 21, 22 connected in series between the power supply Vcc and the ground and compared with the output voltage value V applied to a (+) terminal.

In short, the function of the voltage detection part 3 is to detect that the measurement target magnetic field Ho is counterbalanced by the coil magnetic field H and output a detection signal S. Therefore, the reference voltage value Vref may be predetermined to a value that is to be detected when the strength of the coil magnetic field H is equal to the strength of the measurement target magnetic field Ho, i.e., a value that is to be detected when no magnetic field is applied to the MR elements 11, 12.

However, this is limited to the case where a system in which the measurement target magnetic field Ho should be counterbalanced by the coil magnetic field H is adopted. In the case where the strength of the coil magnetic field H should be offset by a predetermined value for the measurement, however, the coil magnetic field H is only required to cancel a part of the measurement target magnetic field Ho, so that it is exempt from the limitation. In this case, the reference voltage value Vref should be determined based on the offset value. It should be noted that the reference voltage value Vref may be applied to the voltage detection part 3 from a capacitor charged with a predetermined amount of charge, in place of the above voltage-dividing resistors 21, 22.

Here, the voltage detection part 3 is not limited to such a comparing device, i.e., a comparator, but may be a transistor circuit, for example.

When the output voltage value V is equal to or greater than the reference voltage value Vref, the voltage detection part 3 outputs the detection signal S to the current control part 4 and the sample and hold circuit 6. That is, the voltage detection part 3 outputs the detection signal S upon detecting the strength of the measurement target magnetic field Ho.

The current control part 4 includes a counter 41, a digital-to-analog converter (D/A) 42, and a coil driver 43.

The counter 41 is composed of multistage-connected flip-flops and outputs to the digital-to-analog converter 42 a counter value N which increases or decreases (between the minimum value of 0 and the maximum value of Nmax) at regular time intervals in response to a pulse signal CLK input from the oscillator 5. When the detection signal S is input, the counter 41 resets the counter value N to 0 or Nmax.

The oscillator 5 may be a crystal oscillator, for example. The oscillation frequency of the oscillator 5 influences measurement processing time of the circuit and is therefore determined based on intended measurement performance.

The digital-to-analog converter 42 is composed of a transistor, an amplifier, and so on and converts the counter value N being a digital signal to a voltage value E being an analog signal and outputs it to the coil driver 43.

The coil driver 43 controls a current value of the current I flowing through the coil 8 based on the input voltage value E. That is, the coil driver 43 controls the current I to have a current value corresponding to the counter value N. The coil drive 43 may be a current control LSI or the like.

The coil 8 is connected between the coil driver 43 and the ground. The coil 8 is disposed in the vicinity of the MR element circuit 1 and applies the coil magnetic field H to the MR elements 11, 12 when the current I flows therethrough. Here, the number n of turns of the coil 8 influences the strength of the coil magnetic field H and is therefore determined based on intended measurement performance.

When the detection signal S is input, on the other hand, the sample and hold circuit 6 gets and holds the control current value To from the coil driver 43. The control current value To is a current value of the current I when the measurement target magnetic field Ho is counterbalanced by the coil magnetic field H. The sample and hold circuit 6 is composed of a latch circuit including a flip-flop or the like.

The arithmetic circuit 7 is an operational amplifier or a CPU circuit for performing arithmetic processing and periodically gets the control current value Io from the sample and hold circuit 6 to calculate the strength of the measurement target magnetic field Ho based on the current value Io. In general, the strength of the magnetic field Ho is calculated by multiplying the current value I by the number n of turns of the coil 8.

Figure 4:
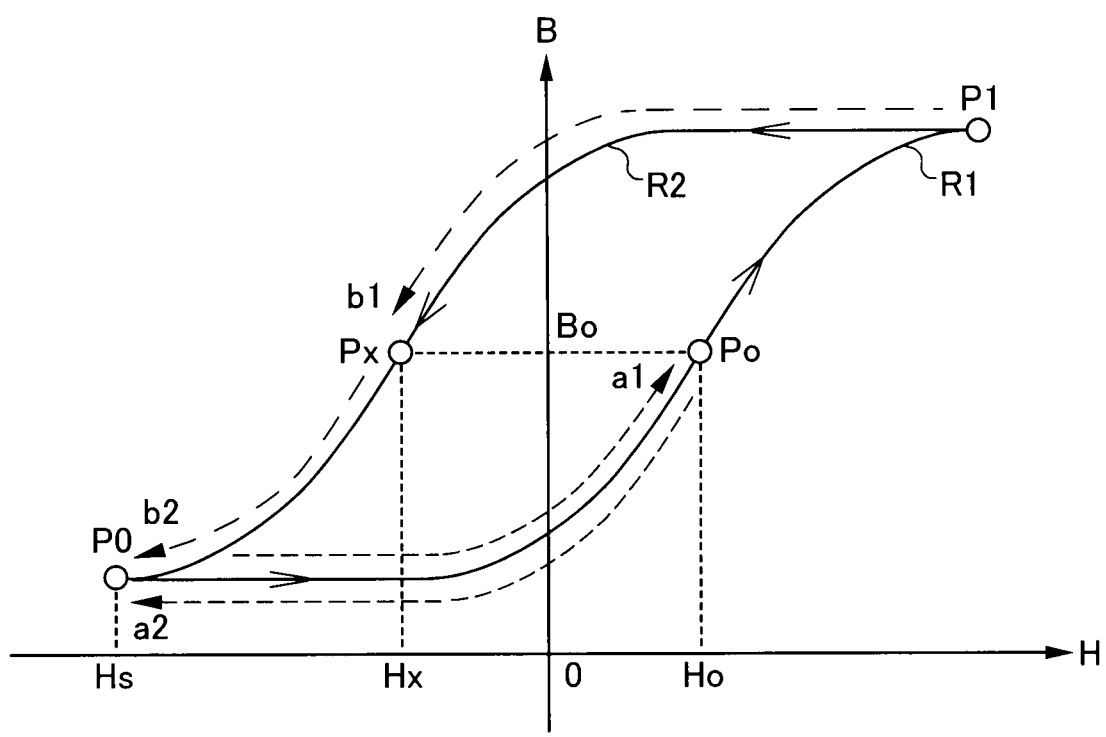
FIG. 4 is a hysteresis curve of a spin valve-type magneto-resistive element showing a current control method.

Next will be described the current control of the current control part 4. FIG. 4 is a hysteresis curve of the MR elements 11, 12 showing a current control method.

On the hysteresis curve, a curve portion indicated by an arrow directed to the right side of the figure as seen from the front is defined as a first route portion R1, while a curve portion indicated by an arrow directed to the left side of the figure as seen from the front is defined as a second route portion R2. In the present embodiment, it is assumed that the operating point of the current control should lie on the first route portion R1.

The current control part 4 controls the current I of the coil 8 to unidirectionally increase the strength of the coil magnetic field H from an initial value Hs. That is, the coil driver 43 controls the current I to increase with an increase or a decrease of the counter value N. The current value of the current I, i.e., the strength of the coil magnetic field H may increase either in a linear function manner or in a quadratic function manner with an increase or a decrease of the counter value N. It should be noted that such a method of unidirectionally increasing a current is different from a method of increasing or decreasing a current in the conventional feedback control system.

Such a control process is shown as a route a1 from a starting point P0 to a detection point Po located on the hysteresis curve in the figure. At the detection point Po, since the measurement target magnetic field Ho is counterbalanced by the coil magnetic field H and therefore the output voltage V becomes equal to or greater than the reference voltage value Vref, the detection signal S is output from the voltage detection part 3.

Then, when the detection signal S is input, the current control part 4 controls the current to return the strength of the coil magnetic field H to the initial value Hs. That is, when the counter value N is reset to 0 or Nmax by the detection signal S, the coil driver 43 returns the current value of the current I of the coil 8 to the initial value. Such a control process is shown as a route a2 from the detection point Po to the starting point P0 located on the hysteresis curve in the figure, for example.

On the other hand, if the current I of the coil 8 overshoots because of noise or the like and the operating point of the current control on the hysteresis curve reaches a saturation point P1, the operating point moves to the unintended second route portion R2 because of the known hysteresis characteristics. In this case, there is a possibility that the detection signal S is output as described above at a false detection point Px where the same magnetic flux density Bo can be obtained as at the detection point Po and the measurement target magnetic field Ho is detected based on a false magnetic field strength Hx. This process is shown as a route b1 from the saturation point P1 to the false detection point Px located on the hysteresis curve in the figure.

Then, also in this case, when the detection signal S is input, the current control part 4 controls the current to return the strength of the coil magnetic field H to the initial value Hs. Such a control process is shown as a route b2 from the false detection point Px to the starting point P0 located on the hysteresis curve in the figure.

In the magnetic sensor according to the present invention, the above initial value Hs is set to a magnetic field strength where the MR elements 11, 12 reach saturation magnetization. Therefore, once the detection signal S is output, the MR elements 11, 12 can always reach magnetization saturation regardless of whether the operating point on the hysteresis curve follows the correct route a1 or the incorrect route b1. In subsequent measurements, therefore, the operating point always lies on the intended first route portion R1.

This is true for the case where the measurement target magnetic field Ho is not present, because the current I of the coil 8 is controlled to be about 0 (A) so as to adjust the coil magnetic field H to about 0 (Oe), which results in outputting the detection signal S. In case the detection signal S is not output for any reason, however, it is also possible to let the current control part 4 reset the counter value N by itself so as to return the coil magnetic field H to the initial value Hs when the detection signal S is not output within a given period of time.

Figure 5:
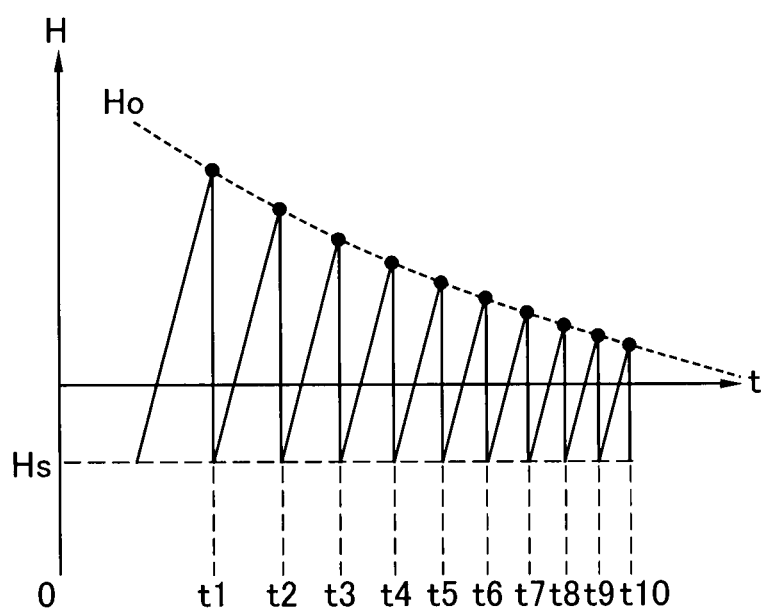
FIG. 5 is a time-magnetic field strength graph showing a current control method.

FIG. 5 is a time-magnetic field strength graph showing the above current control process. Here, a solid line and a dotted line represent the strength of the coil magnetic field H and the strength of the measurement target magnetic field Ho, respectively, while black circles represent detection points of the magnetic field. As illustrated, the coil magnetic field H is reset to the initial value Hs at individual moments t1 to t10, forming a sawtooth wave shape as a whole.

Figure 6:
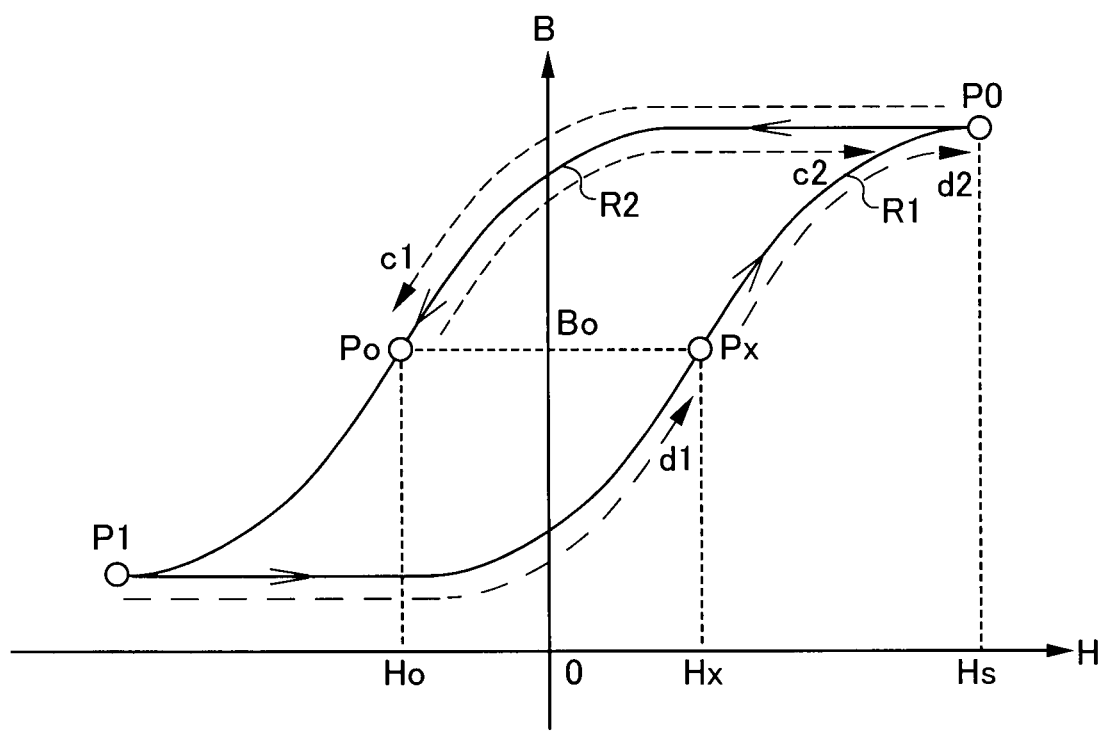
FIG. 6 is a hysteresis curve of a spin valve-type magneto-resistive element showing a current control method according to another embodiment.

The current control thus far described is also true for the case where the operating point on the hysteresis curve is located on the other second route portion R2. FIG. 6 is a hysteresis curve of the MR elements showing a current control method of this case.

The current control part 4 controls the current I of the coil 8 to unidirectionally decrease the strength of the coil magnetic field H from the initial value Hs. That is, the coil driver 43 controls the current I to decrease with an increase or a decrease of the counter value N. Such a control process is shown as a route c1 from a starting point P0 to a detection point Po located on the hysteresis curve in the figure.

Then, when the detection signal S is input, the current control part 4 controls the current to return the strength of the coil magnetic field H to the initial value Hs. That is, when the counter value N is reset to 0 or Nmax by the detection signal S, the coil driver 43 returns the current value of the current I of the coil 8 to the initial value. Such a control process is shown as a route c2 from the detection point Po to the starting point P0 located on the hysteresis curve in the figure, for example.

On the other hand, if the operating point reaches a saturation point P1 on the hysteresis curve, it moves to the unintended first route portion R1. However, as described above, the strength of the coil magnetic field H finally reaches the initial value Hs because of the input of the detection signal S. This process is shown as a route d1 from the saturation point P1 to a false detection point Px located on the hysteresis curve in the figure and as a route d2 from the false detection point Px to the starting point P0.

Here, since the above initial value Hs is also set to a magnetic field strength where the MR elements 11, 12 reach saturation magnetization, the same effects can be obtained as described above.

Figure 7:
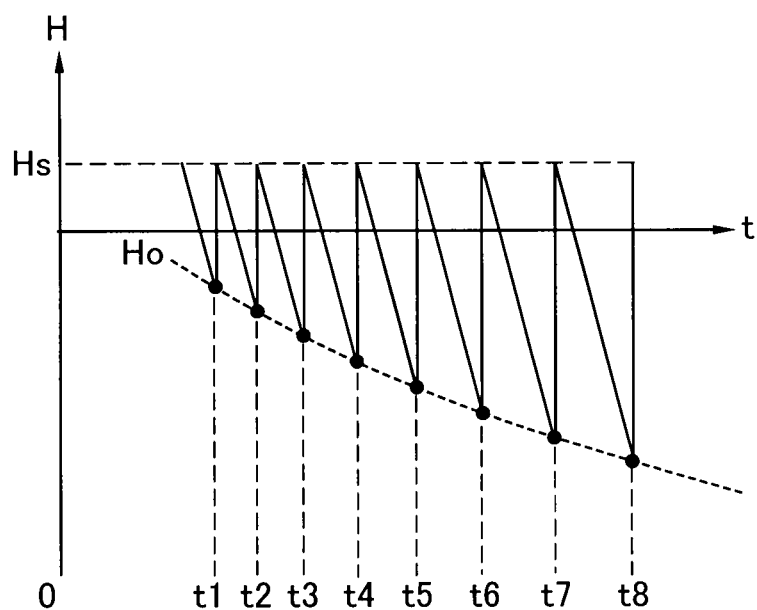
FIG. 7 is a time-magnetic field strength graph showing a current control method according to another embodiment.

FIG. 7 is a time-magnetic field strength graph showing the current control process in the same manner as in FIG. 5. As illustrated, also in this case, the coil magnetic field H forms a sawtooth wave shape as a whole.

Finally, the effects of the present invention will be described below. First of all, since the magnetic sensor according to the present invention measures the measurement target magnetic field Ho using the spin valve-type MR elements 11, 12, miniaturization can be achieved by considerably improving measurement performance, as described above.

In the magnetic sensor according to the present invention, moreover, since the coil 8 applies the coil magnetic field H to the spin valve-type magneto-resistive element 1 upon application of the current I and the current control part 4 controls the current I to unidirectionally increase or unidirectionally decrease the strength of the coil magnetic field H from the initial value, the measurement target magnetic field Ho can be counterbalanced or partially canceled.

Furthermore, since the voltage detection part 3 detects the output voltage V of the spin valve-type magneto-resistive elements 11, 12 reaching the predetermined voltage value Vref, the strength of the measurement target magnetic field Ho can be calculated based on the current value Io of the coil at this moment, as in the above magnetic balance system.

However, the above predetermined voltage value Vref should be properly determined based on the relationship between a magnetic field applied to the spin valve-type magneto-resistive elements 11, 12 and an output voltage therefrom. Preferably, the predetermined voltage value is a value to be detected when the strength of the coil magnetic field H generated from the coil is equal to the strength of the measurement target magnetic field Ho. In other words, the predetermined voltage value Vref is preferably a value to be detected when no magnetic field is applied to the spin valve-type magneto-resistive elements 11, 12.

The characteristic feature of the present invention resides in that the above initial value Hs is a magnetic field strength where the spin valve-type magneto-resistive elements 11, 12 reach saturation magnetization and that the voltage detection part 3 outputs the detection signal S to the current control part 4 upon detecting the output voltage of the spin valve-type magneto-resistive elements 11, 12 reaching the predetermined voltage value Vref and the current control part 4 controls the current I of the coil to return the strength of the coil magnetic field H to the initial value Hs upon input of the detection signal S. This feature is quite different from the magnetic balance system where feedback control is performed by a negative feedback circuit.

With this characteristic feature, every time the measurement is completed, the strength of the applied coil magnetic field H is returned to the initial value Hs and the spin valve-type magneto-resistive elements 11, 12 reach magnetization saturation. Therefore, the operating point of the current control always lies on a certain route portion of the linear route portions R1, R2 of the hysteresis curve. Accordingly, even if the current I flowing through the coil overshoots for any reason and the measurement target magnetic field Ho is detected at an unintended route portion R1, R2, subsequent measurements can be performed at an intended route portion R1, R2.

According to the magnetic sensor of the present invention, therefore, the measurement target magnetic field Ho can be measured with the output voltage V of the magneto-resistive elements 11, 12 and the strength of the applied coil magnetic field H being kept in a one-to-one relationship without being affected by hysteresis.

The present invention has been described in detail above with reference to preferred embodiments. However, obviously those skilled in the art could easily devise various modifications of the invention based on the technical concepts underlying the invention and teachings disclosed herein.

What is claimed is:

1. A magnetic sensor comprising a spin valve-type magneto-resistive element, a voltage detection part, a coil, and a current control part,
    the coil being configured to apply a measuring magnetic field to the spin valve-type magneto-resistive element upon application of a current,
    the voltage detection part being configured to output a detection signal to the current control part upon detecting an output voltage of the spin valve-type magneto-resistive element reaching a predetermined voltage value,
    the current control part being configured to control the current to unidirectionally increase or unidirectionally decrease a strength of the measuring magnetic field from an initial value, but upon input of the detection signal, control the current to return the strength of the measuring magnetic field to the initial value,
    the initial value being a magnetic field strength where the spin valve-type magneto-resistive element reaches saturation magnetization.

2. The magnetic sensor of claim 1, wherein the predetermined voltage value is a value to be detected when the strength of the measuring magnetic field is equal to a strength of a magnetic field to be measured.

3. The magnetic sensor of claim 1, wherein the predetermined voltage value is a value to be detected when no magnetic field is applied to the spin valve-type magneto-resistive element.

4. The magnetic sensor of claim 1, wherein the current control part includes a counter for outputting a counter value increasing or decreasing in response to input of a pulse signal and controls the current to have a current value corresponding to the counter value but resets the counter value upon the input of the detection signal.

5. The magnetic sensor of claim 1, wherein the voltage detection part detects the output voltage reaching the predetermined voltage value by comparing the output voltage with the predetermined voltage value.

6. The magnetic sensor of claim 1, further including an arithmetic circuit for calculating a strength of a magnetic field to be measured based on a current value of the current upon the input of the detection signal to the current control part.

* * * * *